United States Patent
Wang et al.

(10) Patent No.: US 6,893,918 B1
(45) Date of Patent: May 17, 2005

(54) METHOD OF FABRICATING A FLASH MEMORY

(75) Inventors: Leo Wang, Hsinchu (TW); Chien-Chih Du, Hsinchu (TW); Saysamone Pittikoun, Hsinchu (TW)

(73) Assignee: Powerchip Semiconductor Corp., Hsinchu (TW)

( * ) Notice: Subject to any disclaimer, the term of this patent is extended or adjusted under 35 U.S.C. 154(b) by 0 days.

(21) Appl. No.: 10/709,639

(22) Filed: May 19, 2004

(30) Foreign Application Priority Data

Feb. 12, 2004 (TW) ........................................ 93103279 A

(51) Int. Cl.[7] .......................................... H01L 21/336
(52) U.S. Cl. ...................... 438/257; 438/295; 438/300
(58) Field of Search ................................. 438/257, 262, 438/263, 264, 290, 295, 300

(56) References Cited

U.S. PATENT DOCUMENTS 6,656,793 B2 * 12/2003 Jeong et al. ................ 438/257

2004/0087086 A1 * 5/2004 Lee ............................ 438/257

* cited by examiner

Primary Examiner—Phuc T. Dang
(74) Attorney, Agent, or Firm—Jianq Chyun IP Office

(57) ABSTRACT

A method of fabricating a flash memory is provided. A substrate having several device isolation structures for defining an active region is provided. A tunneling dielectric layer and a patterned mask layer are sequentially formed over the active region of the substrate. A sacrificial layer is formed on the substrates. Thereafter, the sacrificial layer is patterned to retain a part of sacrificial layer on the device isolation structures. The patterned mask layer is removed, and a conductive layer that exposed the top section of the sacrificial layers is formed over the substrate. After removing the sacrificial layer, an inter-gate dielectric layer is formed over the substrate. A control gate is formed over the inter-gate dielectric layer. Finally, a source region and a drain region are formed in the substrate on each side of the control gate.

20 Claims, 4 Drawing Sheets

METHOD OF FABRICATING A FLASH MEMORY

CROSS REFERENCE TO RELATED APPLICATIONS

This application claims the priority benefit of Taiwan application serial no. 93103279, filed Feb. 12, 2004.

BACKGROUND OF INVENTION

1. Field of the Invention

The present invention relates to a method of fabricating a memory device. More particularly, the present invention relates to a method of fabricating a flash memory and floating gate.

2. Description of Related Art

Flash memory is a type of electrically erasable programmable read-only memory (EEPROM). Flash memory is a memory device that allows multiple data writing, reading and erasing operations. The stored data will be retained even after power to the device is removed. With these advantages, it has been broadly applied in personal computer and electronic equipment. In addition, the flash memory is also a type of high-speed non-volatile memory (NVM) that occupies very little space and consumes very little power. Moreover, erasing is carried out in a block-by-block fashion so that the operating speed is higher than most conventional memory devices.

A typical flash memory device has a floating gate and a control gate form by doped polysilicon. The control gate is set directly above the floating gate with an inter-gate dielectric layer separating the two. Furthermore, a tunneling oxide layer is also set up between the floating gate and the underlying substrate (the so-called stacked gate flash memory). To operate the flash memory, a positive or negative voltage is applied to the control gate so that electric charges can be injected into or released from the floating gate resulting in the storage or erasure of data.

FIGS. 1A and 1B are cross-sectional views showing part of a prior art process flow of fabricating a flash memory device.

First, as shown in FIG. 1A, a substrate 100 having a plurality of device isolation structures 102 thereon for defining active regions 104 and a tunneling dielectric layer 106 on the active regions 104 is provided.

Then a conductive layer 108 is formed over the substrate 100 to cover the device isolation structures 102 and the tunneling dielectric layer 106. Thereafter, a planarization operation is carried out to remove a portion of the conductive layer 108 and smooth out the top surface of the conductive layer 108.

As shown in FIG. 1B, the conductive layer 108 is patterned for forming a plurality of trenches exposing portions of the isolation structures 102. The remaining conductive layer 108 serves as a floating gate 110. An inter-gate dielectric layer 112 is formed over the substrate 100, covering the floating gate 110. A control gate 114 is formed on the inter-gate dielectric layer 112.

In addition, the aforementioned process utilizes a chemical-mechanical polishing (CMP) operation to planarize the conductive layer 108. Without a reference polishing stop layer, the thickness of conductive layer 108 retained after each chemical-mechanical polishing operation will be different. In other words, there is no control over to the thickness of the floating gate 110.

On the other hand, a higher gate-coupling ratio (GCR) between the floating gate and the control gate requires a lower operating voltage. The methods of increasing the gate-coupling ratio include increasing the capacitance of the inter-gate dielectric layer or reducing the capacitance of the tunneling oxide layer. One method of increasing the capacitance of the inter-gate dielectric layer is to enlarge the overlapping area between the control gate and the floating gate. Thus, minimizing the size of the trenches 107 is able to increase the overlapping area between the floating gate and the control gate and thus increase the gate-coupling ratio between them. However, when the conductive layer 108 is patterned, size of the trenches 107 is constrained by the photolithographic and etching processes. In other words, it is difficult to decrease the size of each trench 107 further. In the absence of any other method for increasing the overlapping area between the control gate and the floating gate, improving the performance of the memory device is difficult.

SUMMARY OF INVENTION

Accordingly, the present invention is directed to a method of fabricating a flash memory adapted to enhance the gate coupling ratio between the floating gate and the control gate for improving device performance.

The present invention is also directed to a method of fabricating a floating gate adapted to resolve the prior art issue of controlling the thickness of the floating gate.

According to an embodiment of the present invention, a substrate having a tunneling dielectric layer and a patterned mask layer sequentially formed thereon is provided. The tunneling dielectric layer and the substrate are patterned by using the patterned mask layer as an etching mask for forming a plurality of trenches in the substrate. The trenches are filled with an isolation material for forming a plurality of isolation structures. A sacrificial material layer is formed over the substrate for covering the patterned mask layer and the isolation structures. The sacrificial material layer is patterned for forming a sacrificial layer in the isolation structure. The patterned mask layer is removed for exposing the tunneling dielectric layer. A first conductive layer is formed over the substrate. A portion of the first conductive layer is removed until a top portion of the sacrificial layer is exposed to form a floating gate. The sacrificial layer is removed and an inter-gate dielectric layer is formed over the substrate for covering the floating gate. A control gate is formed over the inter-gate dielectric layer, and a source region and a drain region are formed in the substrate on each side of the control gate.

Because the thickness of the floating gate of the flash memory fabricated by the present invention is related to the thickness of the sacrificial material layer, the thickness of the floating gate can be adjusted by adjusting the thickness of the sacrificial material layer. Thus, the thickness of the floating gate can be precisely controlled.

Additionally, the present invention can increase the area covered by the control gate and the floating gate by forming mini-size sacrificial layer. Therefore, the gate coupling ratio can be enhanced and the device performance is improved too.

The present invention also provides an alternative method of fabricating a flash memory. A substrate having a plurality of isolation structures for defining an active region is provided. A tunneling dielectric layer and a patterned mask layer sequentially are formed on the active region of the substrate. A sacrificial layer is formed on the substrate. A lithographic-etching process is performed for retaining the sacrificial layer on the isolation structures. The patterned mask layer is removed for exposing the tunneling dielectric layer and a first conductive layer is formed over the substrate. A portion of the first conductive layer is removed until a top of the sacrificial layer is exposed and the sacrificial layer is removed.

Because the thickness of the floating gate of the flash memory fabricated by the present invention correspond to the thickness of the sacrificial material layer, the thickness of the floating gate can be adjusted by adjusting the thickness of the sacrificial material layer. Accordingly, the control of the thickness of the floating gate can be improved.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1A:
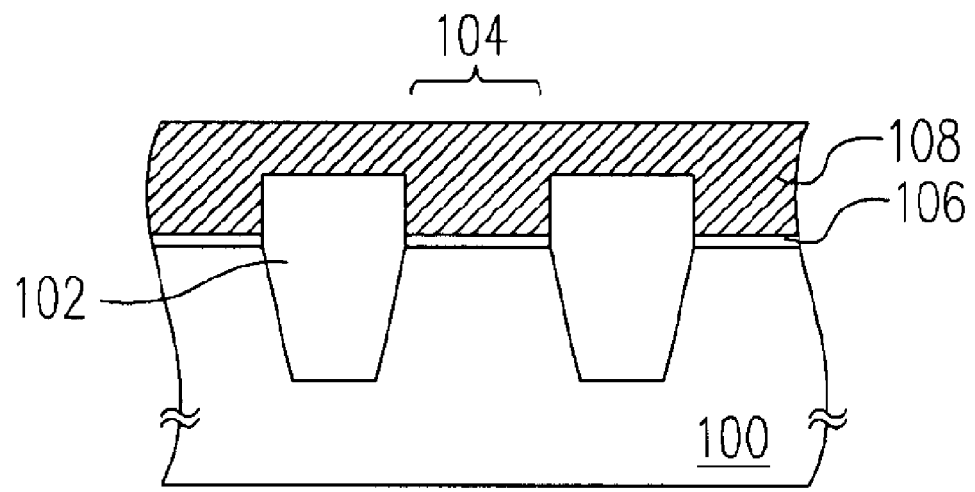
FIGS. 1A through 1B are schematic cross-sectional views showing some of the steps for fabricating a conventional flash memory device.
Figure 1B:
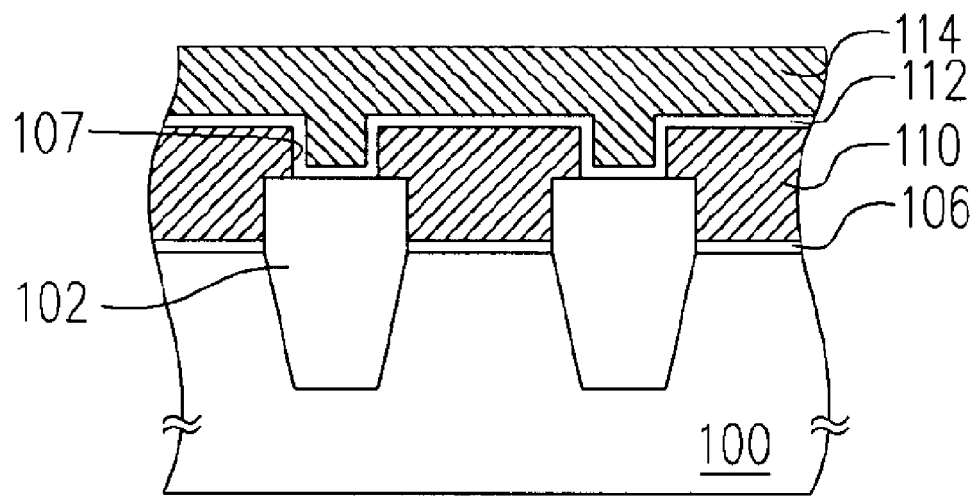

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2E are schematic cross-sectional views showing the steps for fabricating a flash memory according to one embodiment of the present invention.

Figure 2A:
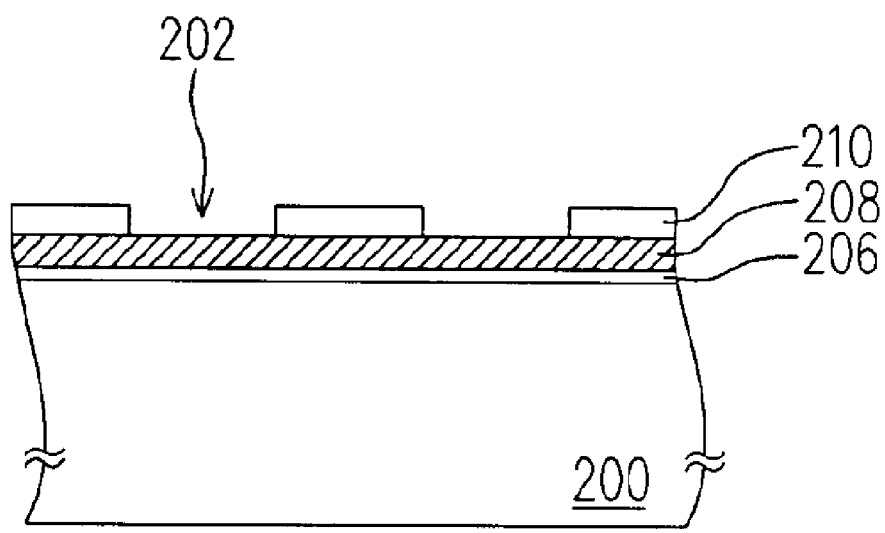
FIGS. 2A through 2E are schematic cross-sectional views showing the steps for fabricating a flash memory according to one embodiment of the present invention.

As shown in FIG. 2A, a substrate 200 such as a silicon substrate is provided. Thereafter, a tunneling dielectric layer 206, a conductive layer 208 and a patterned mask layer 210 are sequentially formed over the substrate 200. The patterned mask layer 210 has openings 202 that expose areas for forming a device isolation structure.

The tunneling dielectric layer 206 is silicon oxide layer having a thickness between about 70 Å to 90 Å formed, for example, by performing a thermal oxidation process. The conductive layer 208 is a doped polysilicon layer formed, for example, by performing a chemical vapor deposition process to form an undoped polysilicon layer (not shown) and then implanting ions into the undoped polysilicon layer to form a doped polysilicon layer. The thickness of the doped polysilicon layer is in a range between about 500 Å to about 1000 Å. Furthermore, the patterned mask layer 210 is form by a material having an etching selectivity that differs from the conductive layer 208, the tunneling dielectric layer 206 and the substrate 200. The patterned mask layer 210 is a silicon nitride layer having a thickness between about 1500 Å to 2000 Å, for example. The patterned mask layer 210 is formed, for example, by performing photolithographic and etching processes.

Figure 2B:
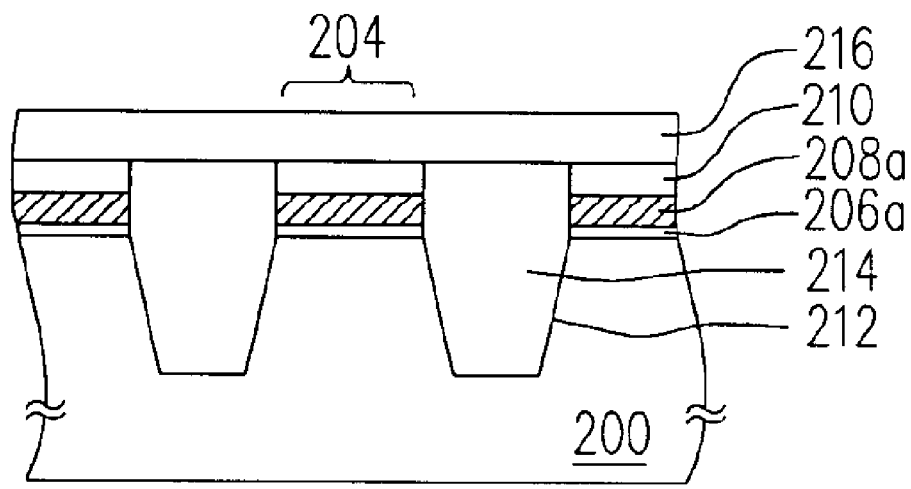

As shown in FIG. 2B, portions of the conductive layer 208, the tunneling dielectric layer 206 and substrate 200 are removed using the patterned mask layer 210 as an etching mask to form a plurality of trenches 212 in the substrate. Ultimately, a tunneling dielectric layer 206a and a conductive layer 208a remain on top of the substrate 200. The trenches 212 have a depth, for example, between about 3000 Å to 4000 Å.

Thereafter, an insulating material is deposited into the trenches 212 to form a plurality of device isolation structure 214 for defining an active region 204. The device isolation structure 214 is formed, for example, by performing a high-density plasma chemical vapor deposition (HDP-CVD) process to form a layer of insulation material (not shown) and then performing a chemical-mechanical polishing (CMP) operation to remove material outside the trenches.

It should be noted that the tunneling dielectric layer 206 is formed before performing the processes related to fabricating the device isolation structures 214. This can prevent the formation of bird's beak in the neighborhood of the device isolation structure due to a subsequent thermal process if the device isolation structure 214 is formed first.

Then, a sacrificial material layer 216 is formed over the substrate 200, covering the patterned mask layer 210 and the isolation structures 214. The materials of the sacrificial material layer and the conductive layer formed subsequently have different etching selectivity. The sacrificial material layer 216 can be, for example, silicon nitride. The sacrificial material layer 216 can be formed by, for example, a chemical vapor deposition method, and have a thickness, for example, from about 1000 Å to about 2000 Å.

Figure 2C:
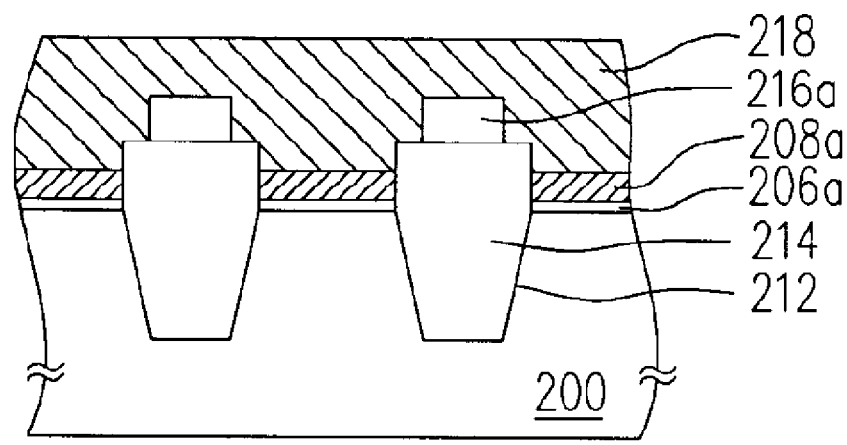

As shown in FIG. 2C, the sacrificial material layer 216 is patterned for forming sacrificial layer 216a on the isolation structures 214. In this embodiment, because the sacrificial material layer 216 and the patterned mask layer 210 have the same material, silicon nitride, the patterned mask layer 210 can be removed during the step of patterning the sacrificial material layer 216. Because the conductive layers 208a have an etching selectivity different from those of the sacrificial material 216 and the patterned mask layer 210, they can be reserved.

Then, a conductive layer 218 is formed on the substrate 200. Because the conductive layer 208a has been formed under the conductive layer 218, the conductive layer 218 can be easily formed thereon. In addition, the conductive layer 218 is a doped polysilicon layer formed, for example, by performing a chemical vapor deposition process to form an undoped polysilicon layer (not shown) and then implanting ions into the undoped polysilicon layer to form a doped polysilicon layer.

Figure 2D:
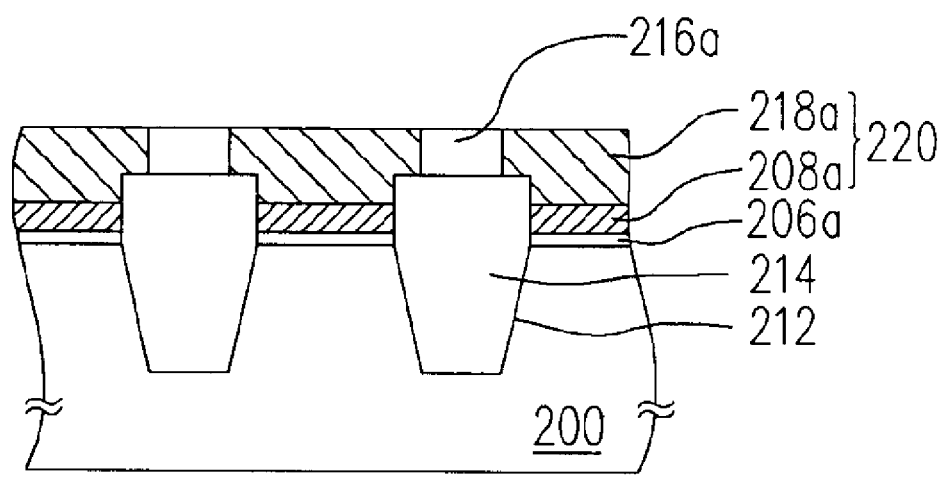

As shown in FIG. 2D, a portion of the conductive layer 218 is removed to expose the top section of the sacrificial layer 216a so that the retained conductive layer 218a and the conductive layer 208a together constitute a floating gate 220. The method of removing a portion of the conductive layer 218 to expose the top section of the sacrificial layer 216a includes performing a chemical-mechanical polishing operation using the sacrificial layer 216a with different etching selectivity as a polishing stop layer. Therefore, the thickness of the floating gate 220 can be well controlled. In other words, during each process, the thickness of the conductive layer 218a can be kept substantially similar by forming the sacrificial layer 216a with the same thickness, for keeping the thickness of the floating gate 220a substantially similar.

Additionally, during forming the sacrificial layer 216a, a small-dimension sacrificial layer 216a can be formed for increasing the dimension of the conductive layer 218a.

Therefore the area between the floating gate 220 and the control gate increases and the gate coupling ratio also enhances.

Figure 2E:
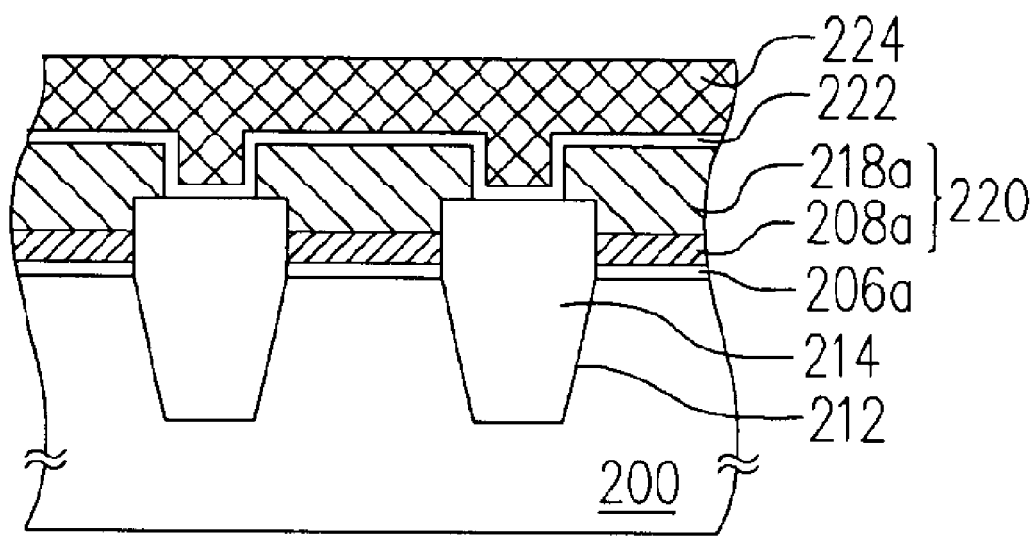

As shown in FIG. 2E, the sacrificial layer 216a is removed. The sacrificial layer 216a can be removed by, for example, a wet etching method using phosphoric acid solution as the etchant. Then, an inter-gate dielectric layer 222 is formed over the substrate 200 to cover the floating gate 220. The inter-gate dielectric layer 222 is an oxide/nitride/oxide composite layer, for example. The inter-gate dielectric layer 222 is formed, for example, by performing a thermal oxidation process to form a silicon oxide layer over the substrate 200 and then performing a chemical vapor deposition process to form a silicon nitride layer and another silicon oxide layer over the first silicon oxide layer. The oxide/nitride/oxide composite layer has a first oxide layer with a thickness between 40 Å to 50 Å, a silicon nitride layer with a thickness between 45 Å to 70 Å and a second silicon oxide between 50 Å to 70 Å. Obviously, the inter-gate dielectric layer 222 can be an oxide/nitride composite layer as well.

A control gate 224 is formed over the inter-gate dielectric layer 222. The control gate 224 is a doped polysilicon formed, for example by performing a chemical vapor deposition process to form a layer of undoped polysilicon (not shown) and implanting ions into the undoped polysilicon layer. Thereafter, a source region (not shown) and a drain region (not shown) are formed in the substrate on each side of the control gate 224. The source region and the drain region are formed, for example, by implanting impurities into the substrate 200 on each side of the control gate 224. Since subsequent fabrication processes should be familiar to those skilled in the techniques, detailed description is omitted here.

Aside from the aforementioned embodiment of the present invention, it should be noted that there is another embodiment. After removing the patterned mask layer 210 in FIG. 2C, the conductive layer 208a is removed before carrying out the step for forming the conductive layer 218 and the processes as shown in FIGS. 2D and 2E. Hence, the completed flash memory has a floating agate 220 including just the conductive layer 218a. Furthermore, in another preferred embodiment, a substrate 200 with only a tunneling dielectric layer 206 and a patterned mask layer 210 thereon is provided in FIG. 2A. Thus, the floating gate 220 of the flash memory also includes a single conductive layer 218a only.

In summary, major advantages of the present invention includes:

1. Because the thickness of the floating gate correspond to the thickness of the sacrificial layer, the thickness of the floating gate can be adjusted by adjusting the thickness of the sacrificial layer. Thus, the thickness of the floating gate can be precisely controlled.
2. The present invention can increase the area covered by the control gate and the floating gate by forming minisize sacrificial layer. Therefore, the gate coupling ratio can be enhanced and the device performance is improved too.
3. The tunneling dielectric layer is formed before carrying out various steps for fabricating the device isolation structures. This can prevent the formation of bird's beak in the neighborhood of the device isolation structure due to a subsequent thermal process when the device isolation structure is formed first. Ultimately, the electrical performance of the memory device is improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a flash memory, comprising the steps of:
   providing a substrate having a tunneling dielectric layer and a patterned mask layer sequentially formed thereon;
   removing portions of the tunneling dielectric layer and the substrate using the patterned mask layer as an etching mask to form a plurality of trenches in the substrate;
   depositing an insulating material into the trenches to form a plurality of device isolation structures;
   forming a sacrificial material layer over the substrate, covering the patterned mask layer and the isolation structure;
   patterning the sacrificial material layer for forming a plurality of sacrificial layers on the isolation structures;
   removing the patterned mask layer for exposing the tunneling dielectric layer;
   forming a first conductive layer over the substrate;
   removing a portion of the first conductive layer to expose top sections of the sacrificial layers to form a plurality of floating gates;
   removing the sacrificial layers;
   forming a inter-gate dielectric layer over the substrate, covering the floating gate;
   forming a control gate over the inter-gate dielectric layer; and
   forming a source region and a drain region in the substrate on each side of the control gate.

2. The method of claim 1, wherein the material of the sacrificial layer and the first conductive layer have different etching selectivities.

3. The method of claim 2, wherein material constituting the sacrificial layer comprises silicon nitride.

4. The method of claim 1, wherein the step for removing a portion of the first conductive layer to expose the top sections of the sacrificial layers comprises performing a chemical-mechanical polishing operation.

5. The method of claim 1, wherein the sacrificial layer and the patterned mask layer are form by identical material so that the patterned mask layer is also removed in the process of patterning the sacrificial material layer.

6. The method of claim 5, the material of the sacrificial layer and the patterned mask layer comprises silicon nitride.

7. The method claim 1, wherein the material of the first conductive layer comprises doped polysilicon.

8. The method of claim 1, further comprising forming a second conductive layer between the tunneling dielectric layer and the patterned mask layer, and the second conductive layer is exposed after the patterned mask layer is removed.

9. The method of claim 8, further comprising removing the second conductive layer after removing the patterned mask layer.

10. The method claim 8, wherein the material of the second conductive layer comprises doped polysilicon.

11. A method of fabricating a floating gate, comprising the steps of:

providing a substrate having a plurality of device isolation structures for defining an active region and a tunneling oxide layer and a patterned mask layer sequentially formed within the active region over the substrate;

forming a sacrificial layer on the substrate;

performing a lithographic-etching process for retaining the sacrificial layer on the isolation structures;

removing the patterned mask layer for exposing the tunneling dielectric layer;

forming a first conductive layer over the substrate;

removing a portion of the first conductive layer until exposing a top of the sacrificial layer; and removing the sacrificial layer.

12. The method of claim 11, wherein the material of the sacrificial layer and the first conductive layer have different etching selectivities.

13. The method of claim 12, wherein the material of the sacrificial layer comprises silicon nitride.

14. The method of claim 11, wherein the step for removing a portion of the first conductive layer to expose the top section of the sacrificial layer comprises performing a chemical-mechanical polishing operation.

15. The method of claim 11, wherein the sacrificial layer and the patterned mask layer are formed by identical material so that the patterned mask layer is also removed in the process of patterning the sacrificial material layer.

16. The method of claim 15, the material of the sacrificial layer and the patterned mask layer comprises silicon nitride.

17. The method claim 11, wherein the material of the first conductive layer comprises doped polysilicon.

18. The method of claim 11, further comprising forming a second conductive layer between the tunneling dielectric layer and the patterned mask layer, and the second conductive layer is exposed after the patterned mask layer is removed.

19. The method of claim 18, further comprising removing the second conductive layer after removing the patterned mask layer.

20. The method claim 18, wherein the material of the second conductive layer comprises doped polysilicon.

* * * * *